United States Patent [19]
Albert

[11] 4,132,137
[45] Jan. 2, 1979

[54] APPARATUS FOR TRIMMING ELECTRICAL COMPONENT LEADS

[75] Inventor: Eugene V. Albert, Wichita, Kans.

[73] Assignee: Q Corporation, Derby, Kans.

[21] Appl. No.: 778,749

[22] Filed: Mar. 14, 1977

[51] Int. Cl.² .............................. B23C 1/08; B26D 7/06
[52] U.S. Cl. ...................................... 83/404; 83/425.2; 83/471; 90/19; 83/925 A
[58] Field of Search .................. 83/404, 925 A, 425.2, 83/425.3, 471; 144/309; 90/19, 21

[56] References Cited

U.S. PATENT DOCUMENTS

| | | | |
|---|---|---|---|
| 3,320,984 | 5/1967 | Stolesen et al. | 144/309 X |
| 3,453,918 | 7/1969 | Sharp | 83/925 |
| 3,972,262 | 8/1976 | Albert | 83/404 X |

*Primary Examiner*—Donald R. Schran
*Attorney, Agent, or Firm*—John H. Widdowson

[57] ABSTRACT

An apparatus for trimming electrical component leads depending from a circuit board includes a plurality of cutters mounted on and spaced along a cutter mounting member supported on a frame supporting a drive motor operatively connected to the cutters for rotating same to trim electrical component leads depending from a circuit board as same is moved along a path structure supported by the frame and above the cutters. The drive motor and cutters are arranged in a pattern so that lead trimming occurs in a minimum area, length, or distance along the path 1. The cutters are adjustable vertically so that the cutters trim the leads at a predetermined spacing from a lower surface of the circuit board.

10 Claims, 5 Drawing Figures

APPARATUS FOR TRIMMING ELECTRICAL COMPONENT LEADS

The present invention relates to apparatus for trimming electrical component leads of circuit boards and more particularly to such an apparatus having a drive motor and cutters arranged in a pattern so that lead trimming occurs in a minimum length of the path of travel of the boards.

The principal objects of the present invention are: to provide an apparatus for trimming electrical component leads depending from a lower surface of a circuit board wherein the trimming occurs in a minimum distance of movement along the apparatus; to provide such an apparatus wherein a plurality of cutters are mounted to permit adjustment of the vertical position of the cutters to trim the leads at a predetermined spacing from a lower surface of the circuit board; to provide such an apparatus having drive means operative to rotate the cutters at speeds of between 5,000 to 7,500 revolutions per minute; to provide such an apparatus wherein the cutters trim the leads in a manner which provides a smooth cut without burrs or other damage; to provide such an apparatus wherein the cutters are arranged in longitudinally and laterally spaced relation so that the cutters have overlapping trim areas; to provide such an apparatus wherein the cutters and drive motor or motors are arranged so that an endless belt extending around pulleys on same has a minimum unsupported length; and to provide such a lead trimming apparatus which is economical to manufacture, durable in construction, positive in operation, and particularly well adapted for the proposed use.

Other objects and advantages of this invention will become apparent from the following description taken in connection with the accompanying drawings wherein are set forth, by way of illustration and example, certain embodiments of this invention.

The drawings constitute a part of the specification and include exemplary embodiments of the present invention and illustrate various objects and features of the apparatus for trimming electrical component leads.

Figure 1:
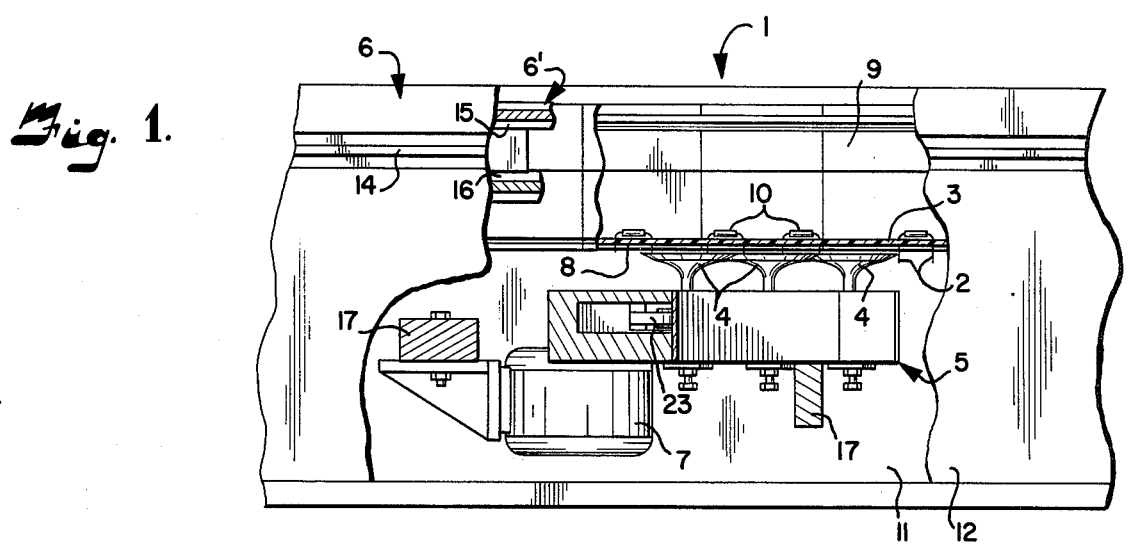
FIG. 1 is a side elevational view of a lead trimming apparatus embodying features of the present invention and with portions broken away to better illustrate the component parts thereof.

As required, detailed embodiments of the present invention are disclosed herein. However, it is to be understood that the disclosed embodiments are merely exemplary of the invention which may be embodied in various forms. Therefore, specific structural and functional details disclosed herein are not to be interpreted as limiting but merely as a basis for the claims and as a representative basis for teaching one skilled in the arts to variously employ the present invention in virtually any appropriately detailed structure.

Referring more in detail to the drawings:

In the disclosed embodiment of the present invention, the reference numeral 1 generally designates an apparatus for trimming electrical component leads 2 depending from a circuit board 3. The lead trimming apparatus 1 includes a plurality of cutters 4 mounted on and spaced along a cutter mounting member 5 supported on a frame 6 which supports a drive motor 7 operatively connected to the cutters 4 for rotating same to trim electrical component leads 2 depending from a circuit board 3 as same is conveyed or moved along a path or track 6' supported on the frame 6 and above the cutters 4. The drive motor 7 and cutters 4 are arranged in a pattern so that lead trimming occurs in a minimum distance or travel along the path 6'. The cutters 4 are adjustable vertically so that the cutters 4 trim the leads 2 at a predetermined spacing from a lower surface 8 of the circuit board 3 prior to soldering.

The apparatus frame 6 may be any suitable structure capable of supporting the drive motor 7, a plurality of the cutters 4, and a suitable guide assembly 9 having therein a circuit board 3 with a plurality of selected electrical components 10 thereon and with the leads 2 depending from a lower surface 8 of the circuit board 3. In the illustrated embodiment, the frame 6 includes a suitable base and laterally spaced longitudinally extending side walls 11 and 12 extending upwardly therefrom. The side walls 11 and 12 define a path through the apparatus 1 for movement of the circuit board 3 during trimming of the leads 2 depending therefrom.

The frame 6 includes means for guiding the circuit board 3 along the path defined by the side walls 11 and 12 and above the cutters 4 so that the leads 2 depending from the circuit board lower surface 8 are trimmed by the cutters 4. In the illustrated embodiment, the guide means includes an adjustably mounted guide rib 14 mounted on each of the frame side walls 11 and 12 and extending inwardly therefrom. The guide ribs 14 are in opposed and aligned relation. Upper and lower guide rails 15 and 16 respectively are mounted on each of the side walls 11 and 12. The guide rails 15 and 16 are positioned on opposite sides of the respective guide rib 14 and cooperate therewith to position the guide assembly 9 during movement of the circuit board 3 and depending leads 2 over the cutters 4.

The guide assembly 9 may be any suitable device operative to support the circuit board 3 with the electrical components 10 thereon during movement of same over the cutters 4. Such a guide assembly is illustrated in U.S. Pat. No. 3,930,646 issued Jan. 6, 1976 to Eugene V. Albert, Jr. for PRINTED CIRCUIT BOARD CARRIER.

The frame 6 includes one or more longitudinally spaced support members 17 extending transversely between the side walls 11 and 12. The frame 6 also includes one or more cutter mounting members 5 supported on the frame 6 and spaced from the drive motor 7. In the embodiment illustrated in FIG. 2, the cutter mounting member 5 is formed of a first portion 19 and a second portion 20 each having one end thereof supported on a respective one of the side walls 11 and 12. The cutter mounting member portions 19 and 20 each have the other end thereof joined together and supported on one of the transverse support members 17.

Figure 3:
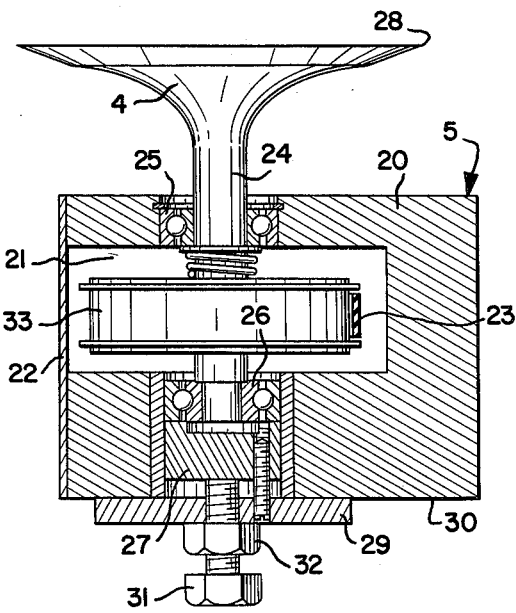
FIG. 3 is an enlarged fragmentary transverse sectional view taken on line 3—3 of FIG. 2 and showing mounting of one cutter.

As best seen in FIG. 3, each of the cutter mounting member portions 19 and 20 has a passage 21 therein extending longitudinally thereof. The passage 21 has an entrance or opening in one side of the respective cutter mounting member portions 19 and 20. The passages 21 in the cutter mounting member portions 19 and 20 also have entrance slots 19' and 20' positioned adjacent the ends of the respective portions 19 and 20 so that an endless belt 23 may be installed in the passage 21. A cover member 22 is mounted on the cutter mounting member one side to close the passage 21 after the endless belt 23 has been mounted therein.

Each of the cutters 4 includes a shaft portion 24 rotatably mounted in suitable upper and lower bearings 25 and 26 respectively each mounted in suitable apertures in the cutter mounting member 5. The lower aperture has a lower bearing support 27 therein with the lower bearing 26 being in engagement with an upper surface thereof.

Each of the portions 19 and 20 of the cutter mounting member 5 includes means thereon for adjusting the vertical position of a cutter ring 28 whereby the cutters 4 trim the leads 2 at a predetermined spacing from the cutter board lower surface 8 prior to or after soldering the trimmed leads to the circuit board lower surface 8. In the illustrated embodiment, a support plate 29 is suitably mounted on a lower surface 30 of each of the cutter mounting member portions 19 and 20. The support plate 29 has a threaded bore therein positioned below and aligned with the lower bearing support 27. A suitable height adjustment screw 31 is received in the bore and engages the lower bearing support 27 whereby the screw is operative to raise or lower the shaft portion 24 of the respective cutter 4. A suitable locking nut 32 is mounted on the shaft of the screw 31 and is in engagement with the support plates 29 thereby retaining the screw 31 and the cutter ring 28 in the desired position.

Each of the cutters 4 has a pulley 33 mounted on the shaft portion 24 thereof. Each pulley 33 is positioned in the passage 21 and is engaged by the endless belt 23 extending around the cutter pulleys 33 and a pulley 34 mounted on the drive motor 7.

Figure 2:
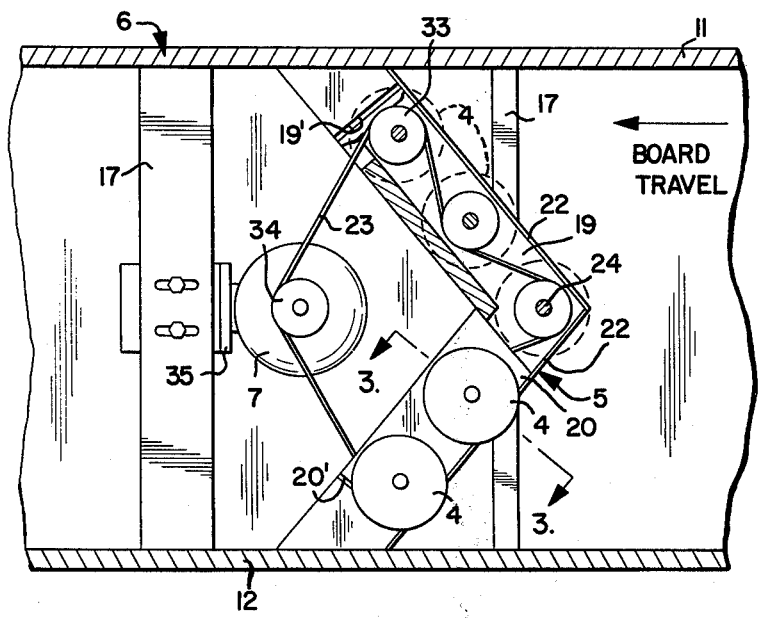
FIG. 2 is a top plan view of the lead trimming apparatus and with portions broken away to better illustrate certain components.

As best seen in FIG. 2, the drive motor 7, cutters 4, and the endless belt 23 are arranged so that adjacent cutters 4 rotate in opposite directions. The illustrated longitudinal and lateral spacing of the cutters 4 effects overlapping trim areas. The cutters 4 and the drive motor 7 are arranged so that the endless belt 23 extending around the pulleys 33 and 34 has a minimum unsupported length between adjacent pulleys.

The drive motor 7 is suitably mounted on one of the support members 17, as on a bracket 35 constructed to support the drive motor 7, in a position spaced from the support member 17 and adjacent the cutter mounting member 5. It is desired that the bracket 35 permit the drive motor 7 to be adjusted vertically so that the pulley 34 on the drive motor 7 is aligned with the pulleys 33 on the cutters 4.

Figure 4:
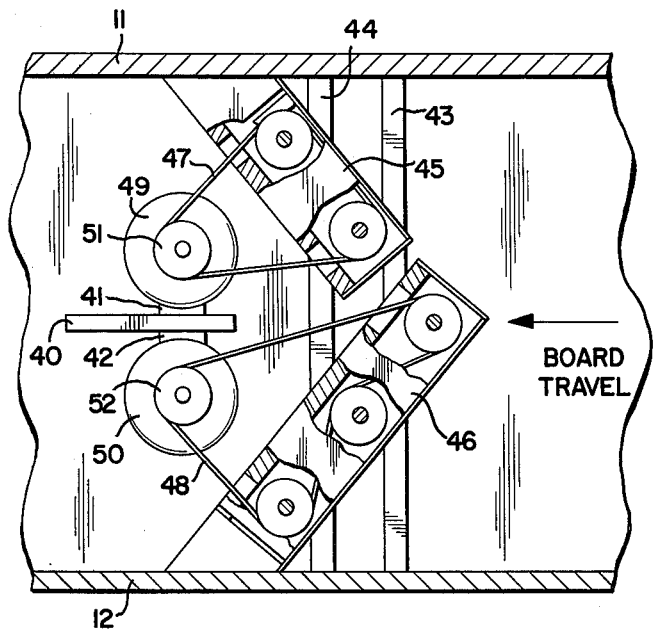
FIG. 4 is a top plan view of a modified lead trimming apparatus and with portions broken away to better illustrate certain components.

FIG. 4 illustrates a modified lead trimming apparatus wherein a motor support member 40 is positioned at the approximate center position between the side walls 11 and 12. First and second motor mounting brackets 41 and 42 are mounted on opposite sides of the motor support member 40. First and second longitudinally spaced support members 43 and 44 extend between the side walls 11 and 12.

First and second cutter mounting members 45 and 46 extend from the side walls 11 and 12 respectively and are supported on the support members 43 and 44. The cutter mounting members 45 and 46 are constructed similar to the cutter mounting portions 19 and 20 and each have a passage therein similar to the passage 21.

The cutter mounting member passages each have an entrance or opening in one side of the respective cutter mounting members 45 and 46. The passages in the cutter mounting members 45 and 46 also have entrance slots similar to the entrance slots 19' and 20' and positioned adjacent the ends of the respective cutter mounting members 45 and 46 so that respective endless belts 47 and 48 may be installed in the respective passage.

The cutters illustrated in FIG. 4 are similar to the cutters 4 illustrated in FIGS. 2 and 3. The mounting of the cutters on the cutter mounting members 45 and 46 is similar to the mounting of the cutters 4 on the cutter mounting member 5, as illustrated in FIG. 3.

First and second drive motors 49 and 50 are mounted on the first and second motor mounting brackets 41 and 42 respectively. The drive motors 49 and 50 have pulleys 51 and 52 respectively thereon which are engaged by the first and second endless belts 47 and 48 respectively.

The cutters illustrated in FIG. 4 are arranged in a first group mounted on the first cutter mounting member 45 and the first endless belt 47 extends around the drive motor pulley 51 and pulleys on the cutters mounted on the first cutter mounting member 45. As illustrated, there are two cutters mounted on the first cutter mounting member 45 and the two cutters rotate in the same direction.

The cutters illustrated in FIG. 4 are arranged in a second group mounted on the second cutter mounting member 46 and the second endless belt 48 extends around the drive motor pulley 52 and pulleys mounted on the cutters on the second cutter mounting member 46. As illustrated, there are three cutters mounted on the second cutter mounting member 46 and the second drive motor 50 and second endless belt 48 are arranged so that adjacent cutters of the three cutters mounted on the second cutter mounting member 46 rotate in opposite directions which is similar to the rotation of the cutters 4 illustrated in FIG. 2.

The cutters 4 in FIG. 2 and the cutters in FIG. 4 are arranged in an inverted V-pattern relative to the travel of the circuit board 3 and the electrical components 10 thereon so that the leads depending from the center area of the circuit board 3 are trimmed before the leads 2 depending from the edge portions of the circuit board 3.

Figure 5:
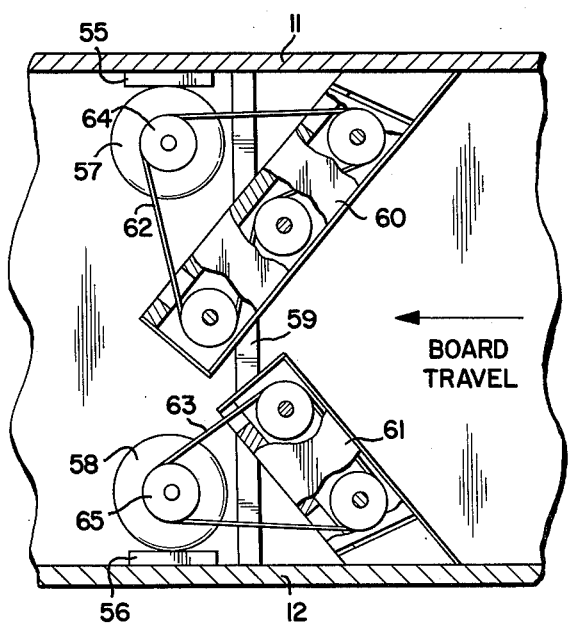
FIG. 5 is a top plan view of a further modified lead trimming apparatus and with portions broken away to better illustrate certain components.

FIG. 5 illustrates a further modified lead trimming apparatus wherein first and second motor mounting brackets 55 and 56 are suitably mounted on the side walls 11 and 12 respectively. The illustrated brackets 55 and 56 are laterally aligned and have first and second drive motors 57 and 58 respectively mounted thereon. A single support member 59 extends between the side walls 11 and 12 and is positioned adjacent the motor mounting brackets 55 and 56.

First and second cutter mounting members 60 and 61 extend from the side walls 11 and 12 respectively and each are supported on the support member 59. The first and second cutter mounting members 60 and 61 are constructed similar to the cutter mounting member portions 19 and 20 and each have a passage therein similar to the passage 21. The cutter mounting members 60 and 61 each have an entrance or opening in one side thereof and the passages in the cutter mounting members 60 and 61 also have entrance slots similar to the entrances slots 19' and 20' and are positioned adjacent the ends of the respective cutter mounting members 60 and 61 so that respective endless belts 62 and 63 may be installed in the respective passage.

The cutters illustrated in FIG. 5 are similar to the cutters 4 illustrated in FIGS. 2 and 3. The mounting of the cutters on the cutter mounting members 60 and 61 is similar to the mounting of the cutters 4 on the cutter mounting member 5, as illustrated in FIG. 3.

First and second drive motors 57 and 58 are on the first and second brackets 55 and 56 respectively. The drive motors 57 and 58 have pulleys 64 and 65 respectively thereon which are engaged by the first and second endless belts 62 and 63 respectively.

The cutters illustrated in FIG. 5 are arranged in a first group mounted on the first cutter mounting member 60 and the first endless belt 62 extends around the drive motor pulley 64 and the pulleys on the cutters mounted on the first cutter mounting member 60. As illustrated, there are three cutters mounted on the first cutter mounting member 60 and as illustrated, the three cutters and the drive motor pulley 64 and the endless belt 62 are arranged so that adjacent cutters of the three cutters mounted on the first cutter mounting member 60 rotate in opposite directions which is similar to the rotation of the cutters 4 illustrated in FIG. 2. As illustrated, there are two cutters mounted on the second cutter mounting member 61 and the two cutters rotate in the same direction.

The cutters illustrated in FIG. 5 are arranged in a V-pattern relative to the travel of the circuit board 3 and the electrical components 10 thereon so that the leads depending from the edge portions of the circuit board 3 are trimmed before the leads 2 depending from the center area of the circuit board 3.

It is to be understood that while I have illustrated and described certain forms of my invention, it is not to be limited to these specific forms or arrangement of parts herein described and shown.

What I claim and desire to secure by Letters Patent is:

1. An apparatus for trimming electrical component leads depending from a circuit board, said apparatus comprising:
    (a) a support structure having a defined path for movement of a circuit board therealong;
    (b) drive means mounted on said support structure and having a pulley thereon;
    (c) a cutter mounting member supported on said support structure and spaced from said drive means;
    (d) a plurality of cutters rotatably mounted on said cutter mounting member and each having a pulley thereon;
    (e) endless belt means extending around and in engagement with the pulley on said drive means and the pulley on each of said cutters for driving said cutters; and
    (f) means on said support structure for guiding and moving a circuit board along said defined path above said cutters so that leads depending from a lower surface of said circuit board are trimmed by said cutters;
    (g) means for adjusting the height of said drive means; and
    (h) means on said cutter mounting member for adjusting the vertical position of each of said cutters whereby said cutters trim the leads at a predetermined spacing from the lower surface of said circuit board.

2. An apparatus for trimming electrical component leads as set forth in claim 1 wherein:
    (a) said drive means includes a first drive motor and a second drive motor each mounted on said supporting structure and each having a pulley thereon;
    (b) said endless belt means includes a first endless belt extending around the pulley on said first drive motor and the pulley on certain of said cutters; and
    (c) said endless belt means includes a second endless belt extending around the pulley on said second drive motor and the pulley on the remainder of said cutters.

3. An apparatus for trimming electrical component leads as set forth in claim 2 wherein:
    (a) said cutter mounting member includes a first portion and a second portion each having a passage therethrough;
    (b) the pulley on each of said cutters is positioned in the passage through said respective cutter mounting member portion; and
    (c) said first and second endless belts are each positioned in the passage through a respective one of said cutter mounting member portions.

4. An apparatus for trimming electrical component leads as set forth in claim 3 including means on each of said cutter mounting member portions for adjusting the vertical position of each of said cutters whereby said cutters trim the leads at a predetermined spacing from the lower surface of said circuit board.

5. An apparatus for trimming electrical component leads as set forth in claim 1 wherein said cutters and said endless belt means are arranged so that adjacent cutters rotate in opposite directions.

6. An apparatus for trimming electrical component leads as set forth in claim 5 wherein:
    (a) said cutter mounting member includes means defining a passage extending longitudinally therethrough;
    (b) the pulley on each of said cutters is positioned in the passage through said cutter mounting member; and
    (c) said endless belt means is positioned in the passage through said cutter mounting member.

7. An apparatus for trimming electrical component leads as set forth in claim 6 wherein the passage through said cutter mounting member includes a first entrance portion and a second entrance portion each permitting positioning said endless belt means in said passage and in engagement with said cutter pulleys and said drive means pulley.

8. An apparatus for trimming electrical component leads as set forth in claim 7 wherein said cutter mounting member includes at least one upper and lower aperture, an upper bearing mounted in said upper aperture, a lower bearing mounted in said lower aperture, a lower support bearing whose upper surface is in engagement with said lower bearing; each of said cutters include a shaft extending through said upper and lower bearing and said lower support bearing, said means for adjusting the vertical position of each of said cutters comprises a support plate means having a bore which threadably engages said shaft, a locking means threadably mounted on said shaft and engaging said support plate means, and a height adjustment means threadably mounted on said shaft after said locking means.

9. An apparatus for trimming electrical component leads as set forth in claim 8 wherein said upper and lower apertures are in communication with said passage.

10. An apparatus for trimming electrical component leads as set forth in claim 9 comprising five cutters positioned in a general V-shape pattern with respect to a horizontal plane such as adjacent cutters have overlapping trim areas and lead trimming occurs in a minimum distance along a given path.

* * * * *